United States Patent
Kuo et al.

(10) Patent No.: US 12,243,860 B2
(45) Date of Patent: Mar. 4, 2025

(54) PACKAGE STRUCTURE, SEMICONDUCTOR DEVICE COMPRISING GRATING COUPLER AND REFLECTOR STRUCTURE EMBEDDED IN THE DIELECTRIC LAYER

(71) Applicant: Taiwan Semiconductor Manufacturing Company, Ltd., Hsinchu (TW)

(72) Inventors: Feng-Wei Kuo, Hsinchu County (TW); Chewn-Pu Jou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 250 days.

(21) Appl. No.: 17/672,705

(22) Filed: Feb. 16, 2022

(65) Prior Publication Data

US 2023/0260978 A1 Aug. 17, 2023

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/08* (2013.01); *H01L 24/80* (2013.01);
(Continued)

(58) Field of Classification Search
CPC ... H01L 24/80; H01L 31/1892; H01L 23/552; H01L 23/5225; H01L 23/60;
(Continued)

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |

(Continued)

OTHER PUBLICATIONS

Kehan Zhu, et al., "Behavioral Modeling and Characterization of Silicon Photonic Mach-Zehnder Modulator", 2017 IEEE 60th International Midwest Symposium on Circuits and Systems (MWSCAS), Aug. 6-9, 2017, pp. 989-992.

(Continued)

*Primary Examiner* — Didarul A Mazumder
(74) *Attorney, Agent, or Firm* — JCIPRNET

(57) ABSTRACT

A package structure includes a photonic die, an electronic die and a gap filling layer. The photonic die includes a dielectric layer, a silicon layer, a reflector structure and a plurality of connection pads. The silicon layer is disposed on the dielectric layer, wherein the silicon layer includes a grating coupler having a plurality of first trench patterns with a first depth and a plurality of second trench patterns with a second depth, wherein the first depth is different than the second depth. The reflector structure is embedded in the dielectric layer below the grating coupler. The connection pads are disposed over the dielectric layer. The electronic die is disposed on the photonic die, wherein the electronic die includes a plurality of bonding pads bonded to the connection pads of the photonic die. The gap filling layer is disposed on the photonic die and surrounding the electronic die.

20 Claims, 13 Drawing Sheets

(51) Int. Cl.
*H01L 31/02* (2006.01)
*H01L 31/0232* (2014.01)
*H01L 31/18* (2006.01)

(52) U.S. Cl.
CPC .. *H01L 31/02005* (2013.01); *H01L 31/02327* (2013.01); *H01L 31/1804* (2013.01); *H01L 31/1892* (2013.01); *H01L 2224/08146* (2013.01); *H01L 2224/80001* (2013.01); *H01L 2924/12043* (2013.01)

(58) Field of Classification Search
CPC ......... H01L 2924/3025; H01L 23/5227; H01L 28/10; H01L 2924/19042; H01L 2924/30107; H01L 2224/08265; H01L 2924/19104
USPC .................................. 257/211; 438/128, 129
See application file for complete search history.

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2010/0111473 A1* | 5/2010 | Pinguet | G02B 6/34 385/37 |
| 2015/0260913 A1* | 9/2015 | Li | G02B 6/124 385/14 |
| 2016/0131848 A1* | 5/2016 | Svilans | G02B 6/125 385/14 |
| 2016/0238793 A1* | 8/2016 | Frankel | G02B 6/14 |
| 2017/0207600 A1* | 7/2017 | Klamkin | H01S 5/142 |
| 2019/0154916 A1* | 5/2019 | Pinguet | G02B 6/124 |
| 2020/0241205 A1* | 7/2020 | Kojima | H01S 5/142 |
| 2021/0333491 A1* | 10/2021 | Menezo | G02B 6/34 |

OTHER PUBLICATIONS

Hongqiang Li, et al., "Highly efficient polarization-independent grating coupler used in silica-based hybrid photodetector integration" Optical Engineering, vol. 53, No. 5, May 2014, pp. 1-8.

* cited by examiner

PACKAGE STRUCTURE, SEMICONDUCTOR DEVICE COMPRISING GRATING COUPLER AND REFLECTOR STRUCTURE EMBEDDED IN THE DIELECTRIC LAYER

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
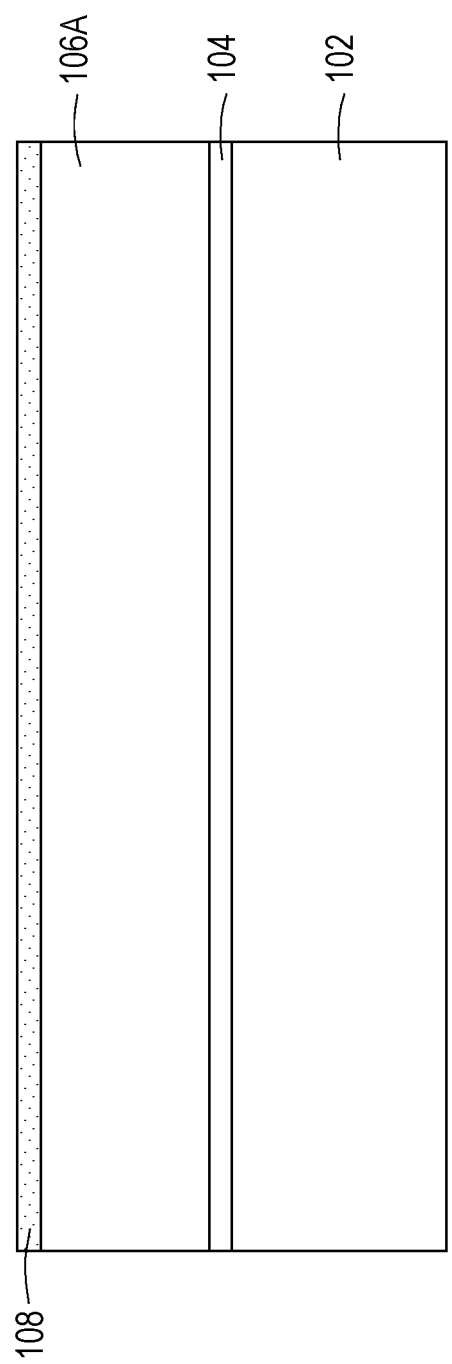
FIG. 1A to FIG. 1G are schematic sectional views of various stages in a method of fabricating a package structure in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic sectional views of various stages in a method of fabricating a package structure in accordance with some embodiments of the present disclosure. Referring to FIG. 1A, a carrier 102 is provided. In some embodiments, the carrier 102 may be a glass carrier or any suitable carrier for carrying a semiconductor wafer or a reconstituted wafer for the manufacturing method of the stacked die package. In some embodiments, the carrier 102 is coated with a debond layer 104. The material of the debond layer 104 may be any material suitable for bonding and de-bonding the carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 104 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

Referring to FIG. 1A, a first dielectric layer 106A is disposed on the debond layer 104. For example, the first dielectric layer 106A may include an oxide such as silicon oxide, and may be referred to as a buried oxide layer (BOX). Subsequently, a reflector structure 108 is formed over the first dielectric layer 106A. In some embodiments, the reflector structure 108 may entirely cover a surface of the first dielectric layer 106A. In alternative embodiments, the reflector structure 108 may be patterned, and the patterned reflector structure 108 cover portions of the first dielectric layer 106A. In certain embodiments, a material of the reflector structure 108 may include aluminum (Al), copper (Cu), ruthenium (Ru), manganese (Mn), titanium nitride (TiN), titanium (Ti), tantalum nitride (TaN), silicon nitride, combinations thereof, or the like.

Figure 1B:
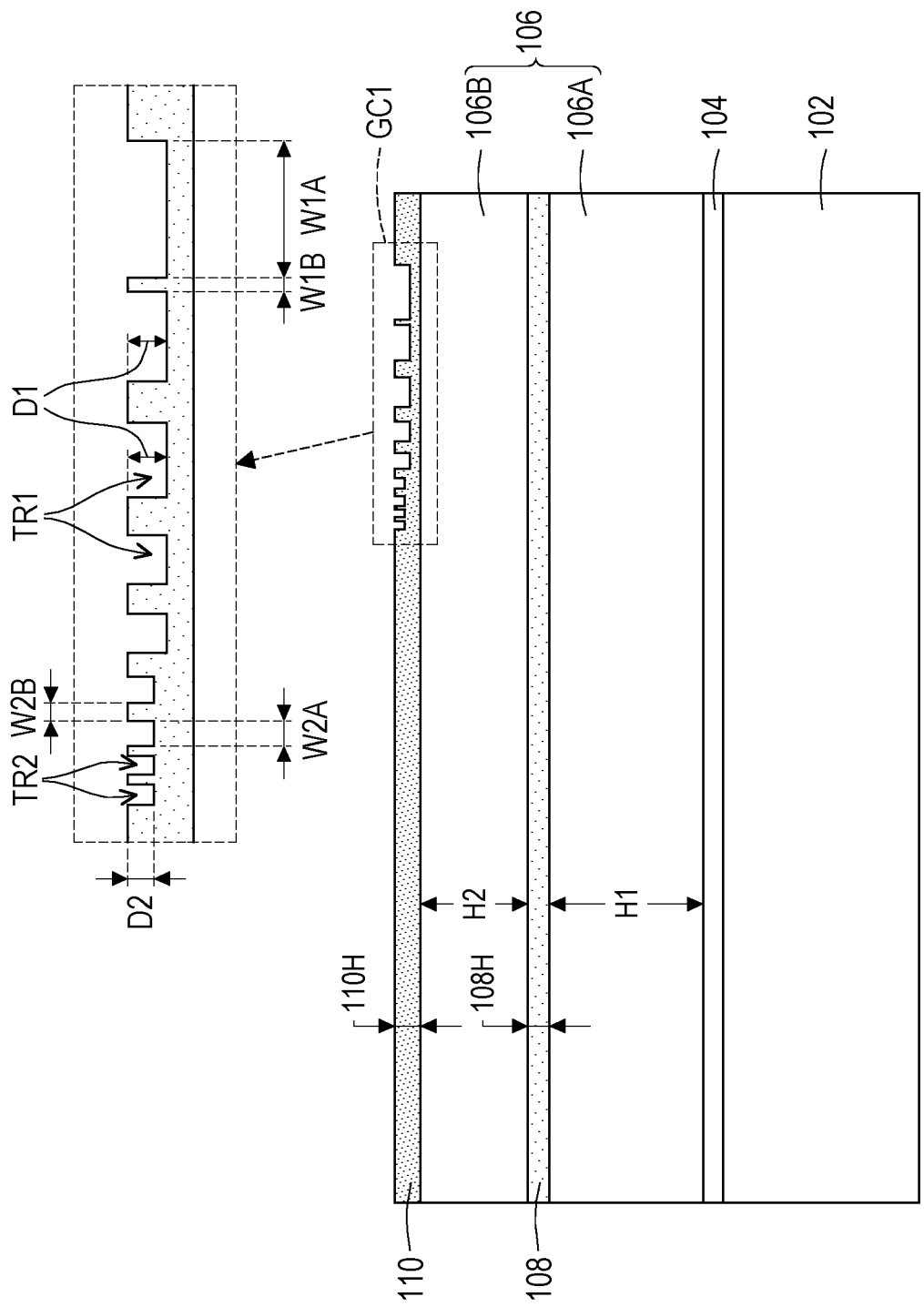

Referring to FIG. 1B, a second dielectric layer 106B is disposed on the reflector structure 108. For example, the reflector structure 108 is disposed in between the first dielectric layer 106A and the second dielectric layer 106B. The second dielectric layer 106B may include an oxide such as silicon oxide, and may be referred to as a buried oxide layer (BOX). In some embodiments, the first dielectric layer 106A and the second dielectric layer 106B together constitute a dielectric layer 106. In certain embodiments, the reflector structure 108 is embedded in the dielectric layer 106. After forming the dielectric layer 106, a silicon layer 110 is disposed on the dielectric layer 106.

In some embodiments, the first dielectric layer 106A has a thickness of H1, the reflector structure 108 has a thickness of 108H, the second dielectric layer 106B has a thickness of H2, and the silicon layer 110 has a thickness of 110H. In some embodiments, the thickness H1 of the first dielectric layer 106A and the thickness H2 of the second dielectric layer 106B are greater than the thickness 108H of the reflector structure and the thickness 110H of the silicon layer 110. In some embodiments, a ratio of the thickness 108H of the reflector structure 108 to the thickness 110H of the silicon layer 110 is in a range of 1:1 to 1:30. In other words, the thickness 110H of the silicon layer 110 may be substantially equal to, or greater than the thickness 108H of the reflector structure 108. In one exemplary embodiment, the thickness 108H of the reflector structure 108 is in a range of 10 nm to 1000 nm and the thickness 110H of the silicon layer 110 is in a range of 100 nm to 1000 nm. However, the disclosure is not limited thereto, and the thickness 108H of the reflector structure 108 and the thickness 110H of the silicon layer 110 may adjusted based on product requirement.

As further illustrated in FIG. 1B, in some embodiments, the silicon layer 110 is patterned to form a grating coupler GC1 having a plurality of first trench patterns TR1 and a plurality of second trench patterns TR2. For example, the silicon layer 110 is patterned through multi-etching techniques to form the grating coupler GC1 having different trench pattern depths. In some embodiments, the grating coupler GC1 may be an apodized grating coupler, and the reflector structure 108 is located at an area below the grating coupler G1. In some embodiments, the first trench patterns TR1 have a first depth D1, while the second trench patterns TR2 have a second depth D2, and the first depth D1 is different than the second depth D2. In some embodiments, the first depth D1 is greater than the second depth D2. In one exemplary embodiment, when the thickness 110H of the silicon layer 110 is 270 nm or more, the first depth D1 is larger than 50 nm while the second depth is larger than 140 nm. Although the grating coupler GC1 is shown to have a grating slope θ1 of approximately 90°, the disclosure is not limited thereto. In some other embodiments, the grating coupler GC1 have a grating slope θ1 in a range of 60° to 90°.

Furthermore, in some embodiments, in the grating coupler GC1, the first trench patterns TR1 have a variable width of W1A and is spaced apart from one another by a variable width of W1B. Similarly, the second trench patterns TR2 have a variable width of W2A and is spaced apart from one another by a variable width of W2B. In one exemplary embodiment, the width W1A of the first trench patterns TR1 and the width W2A of the second trench patterns TR2 may be in a range of 170 nm to 600 nm, and the width W1B and the width W2B may be in a range of 60 nm to 200 nm. In some embodiments, at a wavelength of 1310 nm for the grating coupler GC1, a sum (W1A+W1B) of the width W1A and the width W1B is 600 nm or less, and a sum (W2A+W2B) of the width W2A and the width W2B is 600 nm or less for enhancing coupler efficiency.

Figure 1C:
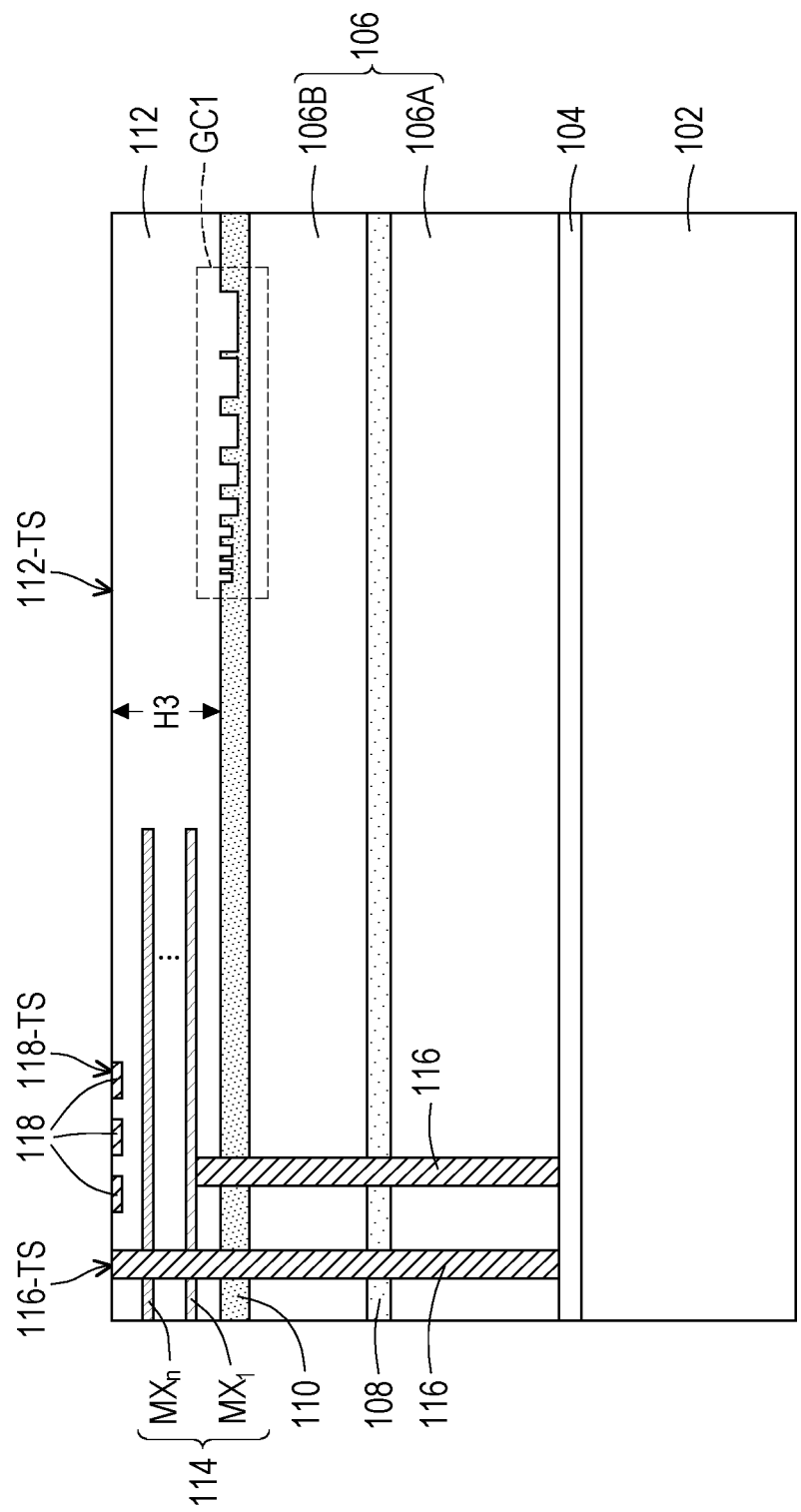

Referring to FIG. 1C, after forming the silicon layer 110, a dielectric layer 112 is formed over the silicon layer 110 to cover the silicon layer 110. The dielectric layer 112 has a thickness of H3, whereby a ratio (H3:H1) of the thickness H3 of the dielectric layer 112 to the thickness H1 of the first dielectric layer 106A is in a range of 1:1 to 1:10. Similarly, a ratio (H3:H2) of the thickness H3 of the dielectric layer 112 to the thickness H2 of the second dielectric layer 106B is in a range of 1:1 to 1:10. In some embodiments, the dielectric layer 112 may be an oxide layer such as silicon oxide, or the like. In some embodiments, an interconnection layer 114 is formed within the dielectric layer 112. For example, the interconnection layer 114 may include a plurality of metallization layers $MX_1 \sim MX_n$ (where n is an integer of 2 or more) stacked up over the silicon layer 110 and embedded in the dielectric layer 112. In one exemplary embodiment, there are six metallization layers $MX_1 \sim MX_6$ embedded in the dielectric layer 112.

In some embodiments, a plurality of through dielectric vias 116 are formed in the dielectric layer 112. In certain embodiments, some of the through dielectric vias 116 are electrically connected to the plurality of metallization layers $MX_1 \sim MX_n$, while some of the through dielectric vias 116 may pass through the interconnection layer 114, the dielectric 106, the reflector structure 108 and extend towards the debond layer 104 and extend towards a top surface 112-TS of the dielectric layer 112. In some embodiments, a plurality of connection pads 118 is disposed over the interconnection layer 114 and over the dielectric layer 106. The connection pads 118 are exposed at the top surface 112-TS of the dielectric layer 112. In some embodiments, a top surface 116-TS of a portion of the through dielectric vias 116 is coplanar and aligned with a top surface 118-TS of the connection pads 118, and aligned with the top surface 112-TS of the dielectric layer 112.

Figure 1D:
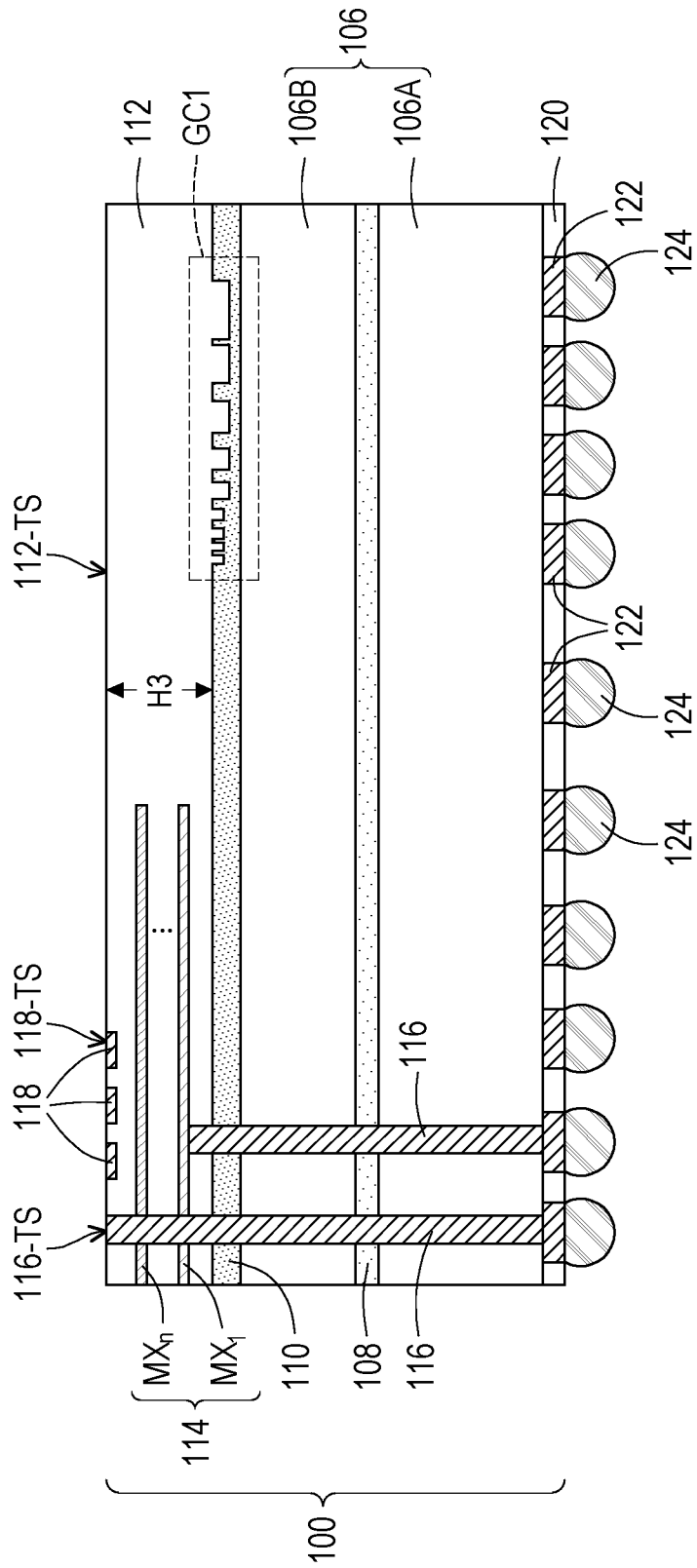

Referring to FIG. 1D, in a subsequent step, the carrier 102 is de-bonded and is separated from the dielectric layer 106. For example, the de-bonding process includes projecting a light such as a laser light or an UV light on the debond layer 104 (e.g., the LTHC release layer) so that the carrier 102 can be easily removed along with the debond layer 104. After the de-bonding process, a backside surface of the dielectric layer 106, and backside surfaces of the through dielectric vias 116 may be revealed or exposed. In some embodiments, a dielectric layer 120 and a plurality of conductive pads 122 embedded in the dielectric layer 120 are disposed on the backside surface of the dielectric layer 106. For example, the conductive pads 122 and the silicon layer 110 are located on two opposing surfaces of the dielectric layer 106. Some of the conductive pads 122 may be electrically connected to the through dielectric vias 116. Furthermore, a material of the conductive pads 122 may include aluminum copper (AlCu), for example. After forming the dielectric layer 120 and the conductive pads 122, a photonic die 100 in accordance with some exemplary embodiments of the present disclosure is accomplished. In some embodiments, a plurality of conductive bumps 124 is disposed on and electrically connected to the conductive pads 122 of the photonic die 100 for bonding the photonic die 100 to other components.

Figure 1E:
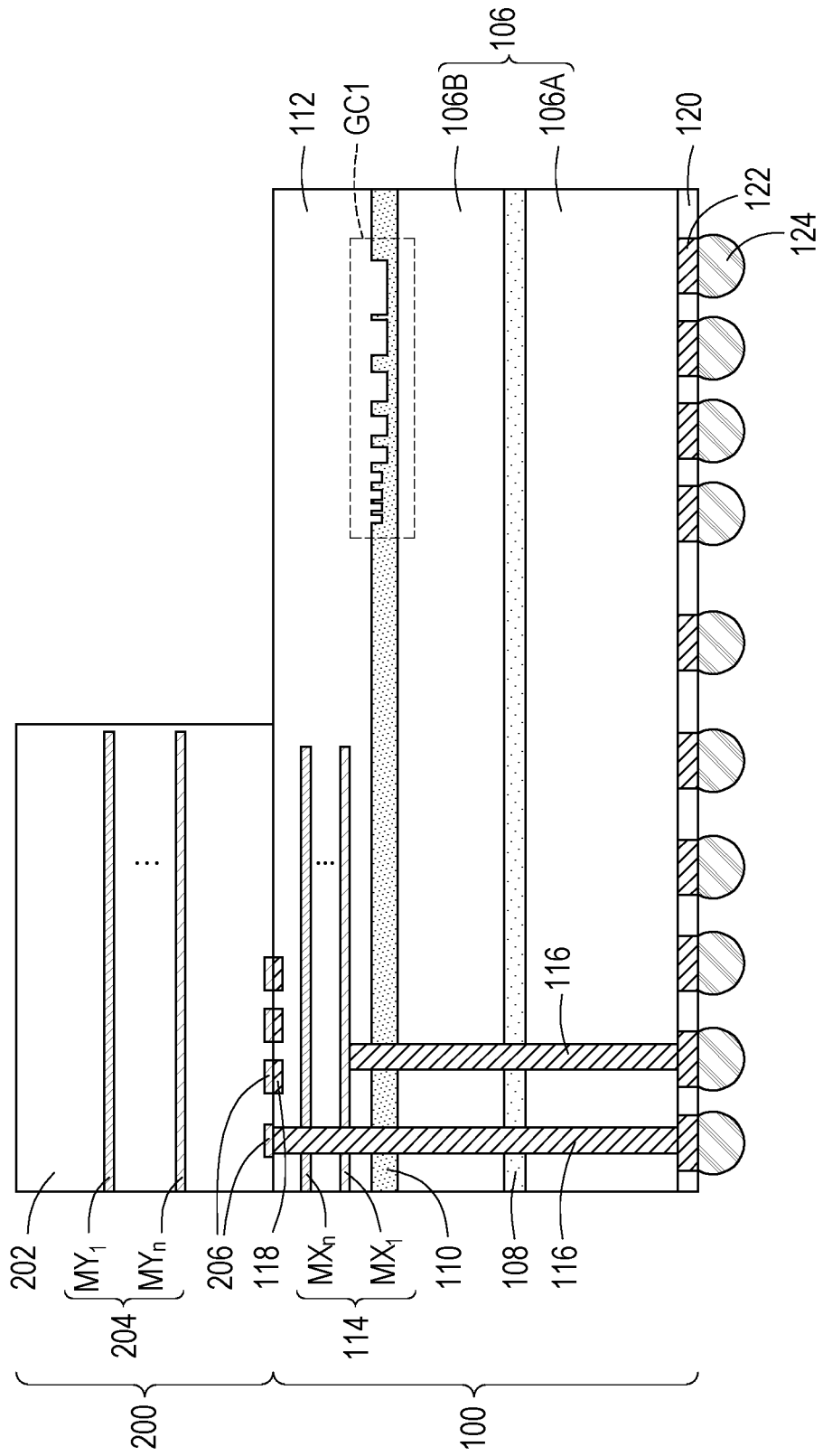

Referring to FIG. 1E, in a subsequent step, an electronic die 200 is stacked on the photonic die 100. In some embodiments, the electronic die 200 is disposed on and attached to the photonic die 100 through hybrid bonding. In some embodiments, the electronic die 200 includes a dielectric layer 202, an interconnection layer 204 embedded in the dielectric layer 202 and a plurality of bonding pads 206 exposed at a surface of the dielectric layer 202. In some embodiments, the interconnection layer 204 include a plurality of metallization layers $MY_1 \sim MY_n$ (where n is an integer of 2 or more) embedded in the dielectric layer 202. In certain embodiments, some of the bonding pads 206 are electrically connected to the metallization layers $MY_1 \sim MY_n$ by a plurality of through vias (not shown). Furthermore, the bonding pads 206 of the electronic die 200 are electrically connected and bonded to the connection pads 118 of the photonic die 100. The through dielectric vias 116 of the photonic die 100 may be electrically connected and attached to some of the bonding pads 206 of the electronic die 200.

In some embodiments of the present disclosure, the electronic die 200 acts as a central processing unit, which includes controlling circuits for controlling the operation of the devices in photonic die 100. In addition, electronic die 200 may include the circuits for processing the electrical signals converted from the optical signals in photonic die 100. In certain embodiments, electronic die 200 may include driver circuitry for controlling optical modulators in the photonics die 100 and gain amplifiers for amplifying the electrical signals received from the photodetectors in photonic die 100. Electronic die 200 may also exchange electrical signals with photonic die 100. The photonic die 100 has the function of receiving optical signals, transmitting the optical signals inside the photonic die 100, transmitting the optical signals out of photonic die 100, and/or communicating electronically with the electronic die 200. In some embodiments, the photonic die 100 is also responsible for the Input-Output (IO) of the optical signals and/or electrical signals.

Figure 1F:
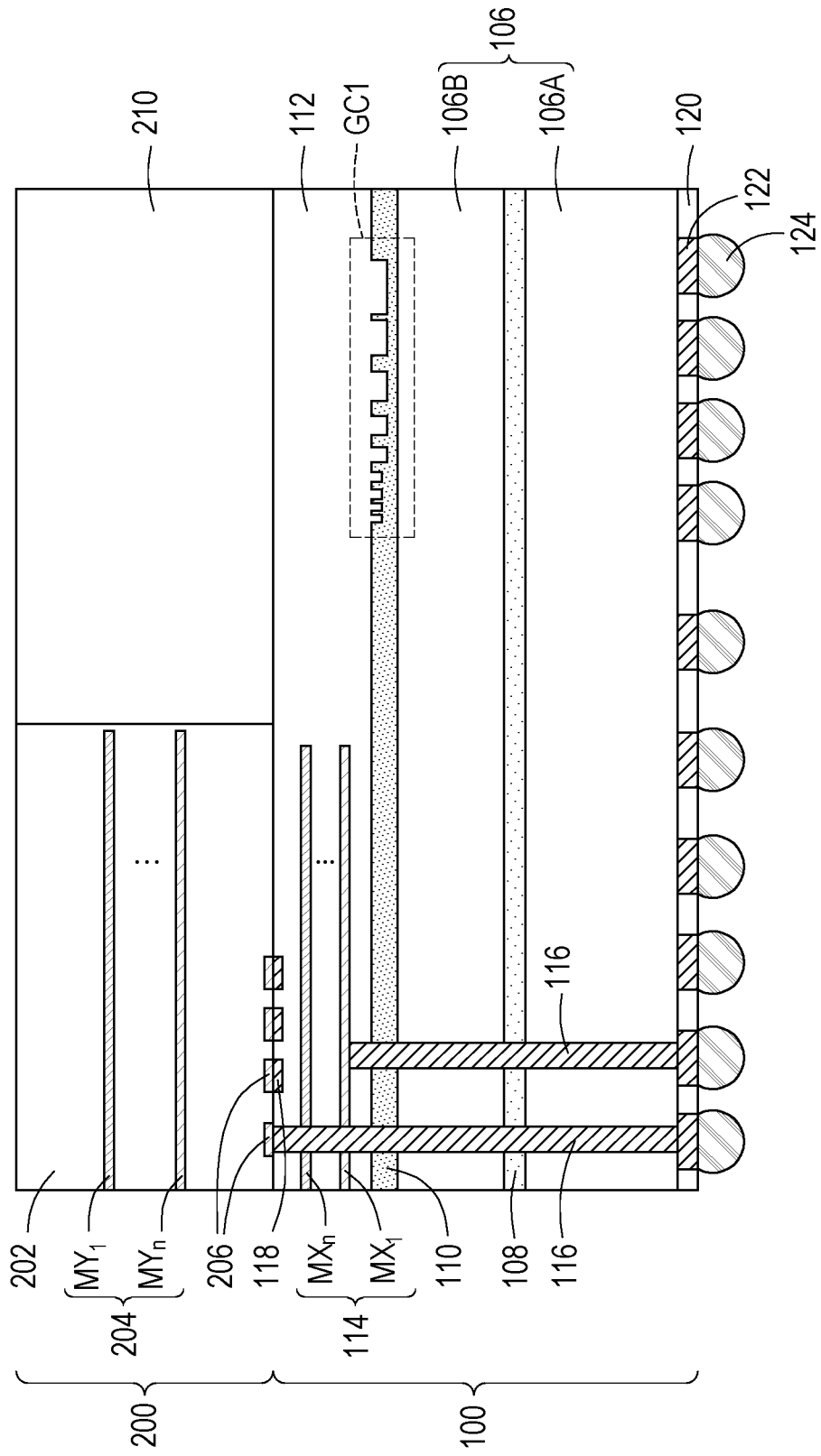

Referring to FIG. 1F, after bonding the electronic die 200 to the photonic die 100, a gap filling layer 210 is disposed on the photonic die 100 to surround the electronic die 200. The gap filling layer 210 is an oxide layer, for example. In some embodiments, a sidewall of the gap filling layer 210 is aligned with a sidewall of the photonic die 100. In some embodiments, at least one side surface of the electronic die 200 is not covered by the gap filling layer 210, and such side surface is aligned with the side surface of the photonic die 100. However, the disclosure is not limited thereto. In alternative embodiments, depending on the size of the electronic die 200, the gap filling layer 210 may be disposed on the photonic die 100 to surround all side surfaces of the electronic die 200.

Figure 1G:
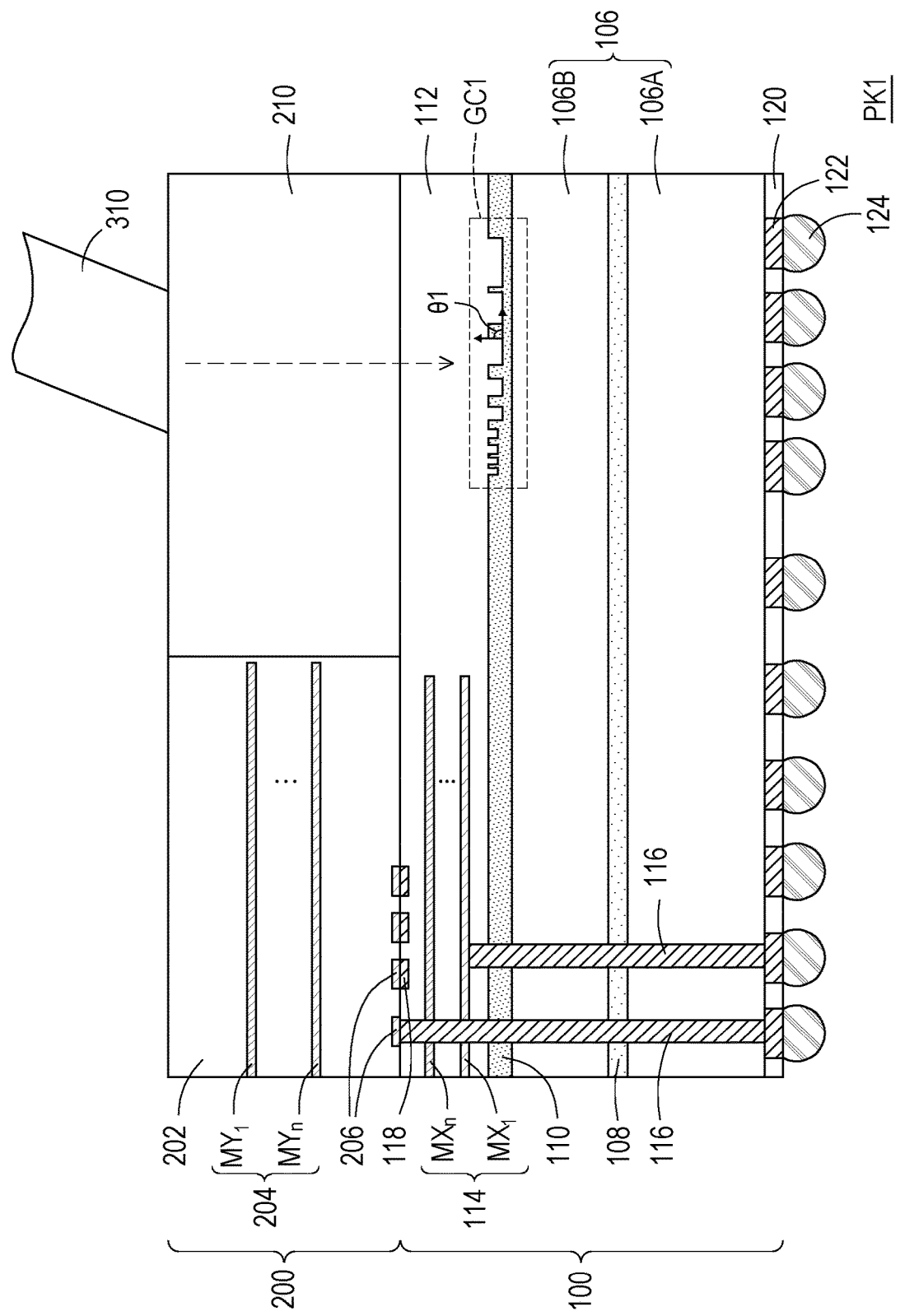

Referring to FIG. 1G, in a subsequent step, a fiber structure 310 may be disposed on the gap filling layer 210. For example, the fiber structure 310 is overlapped with the grating coupler GC1, and a fiber tilt angle of the fiber structure 310 relative to a plane perpendicular to the grating coupler GC1 is in a range of 5° to 15°. In one exemplary embodiment, the fiber tilt angle of the fiber structure 310 is 8°. By controlling the fiber tilt angle of the fiber structure 310 in such a range, a coupler efficiency may be improved. In some embodiments, the fiber structure 310 is an optical input that transmits optical data/optical signal to the grating coupler GC1 (as indicated by the arrow). For example, light transmitted in the fiber structure 310 is projected onto the grating coupler GC1, and the grating coupler GC1 has the function of receiving light or transmitting light. Up to here, a package structure PK1 (stacked die package or semiconductor device) in accordance with some embodiments of the present disclosure is accomplished. In the package structure PK1, since the reflector structure 108 is disposed in the photonic die 100 in an area below the grating coupler GC1, the reflector structure 108 can recycle leaked optic energy to further enhance the coupler efficiency of the grating coupler GC1.

Figure 2:
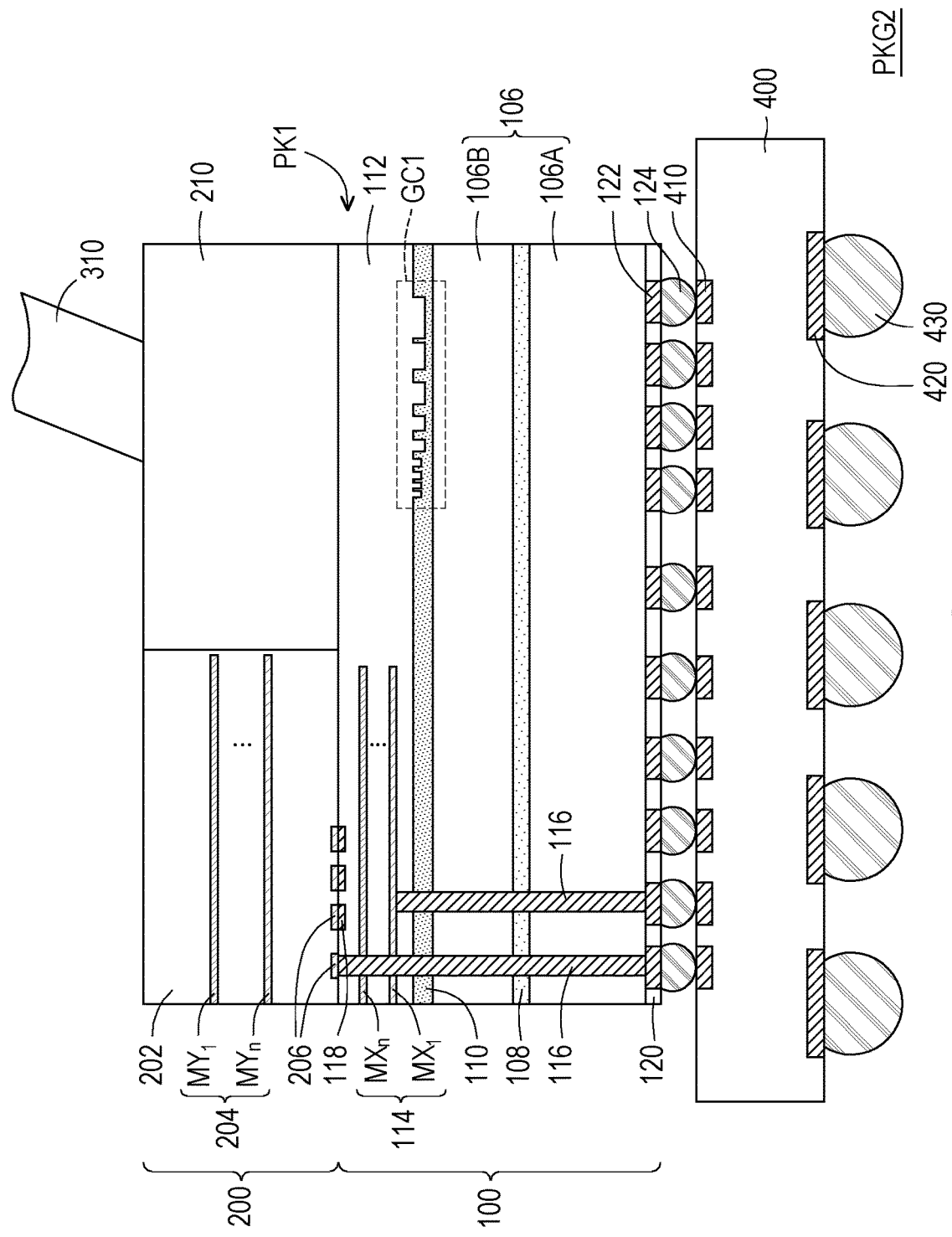
FIG. 2 is a schematic sectional view of a package structure in accordance with some other embodiments of the present disclosure.

FIG. 2 is a schematic sectional view of a package structure in accordance with some other embodiments of the present disclosure. As illustrated in FIG. 2, in some embodiments, the package structure PK1 (the stacked ide package) illustrated in FIG. 1G is further disposed on a circuit substrate 400 to obtain a package structure PKG2 (or semiconductor device). The circuit substrate 400 may be an organic flexible substrate or a printed circuit board, for example. In some embodiments, the circuit substrate 400 includes contact pads 410, contact pads 420, metallization layers and vias (not shown) disposed in between the contact pads 410 and the contact pads 420. The contact pads 410 and the contact pads 420 are respectively distributed on two opposite sides of the circuit substrate 400, and are exposed for electrically connecting with later-formed elements/features. In some embodiments, the metallization layers and the vias are embedded in the circuit substrate 400 and together provide routing function for the circuit substrate 400. For example, the metallization layers and the vias may be electrically connected to some of the contact pads 410 and some of the contact pads 420. In some embodiments, the contact pads 410 and the contact pads 420 may include metal pads or metal alloy pads.

As illustrated in FIG. 2, the package structure PK1 (the stacked ide package) is bonded to the circuit substrate 400 by physically connecting the conductive bumps 124 to the contact pads 410 of the circuit substrate 400. In other words, the package structure PK1 is electrically connected to the circuit substrate 400 through the conductive bumps 124. In some embodiments, a plurality of conductive terminals 430 is formed over the circuit substrate 400. For example, the conductive terminals 430 are electrically connected to the contact pads 420 of the circuit substrate 400. Through the contact pads 410 and the contact pads 420, some of the conductive terminals 430 are electrically connected to the photonic die 100 or electronic die 200 of the package structure PK1. In some embodiments, the conductive terminals 430 are, for example, solder balls or ball grid array (BGA) balls.

Figure 3:
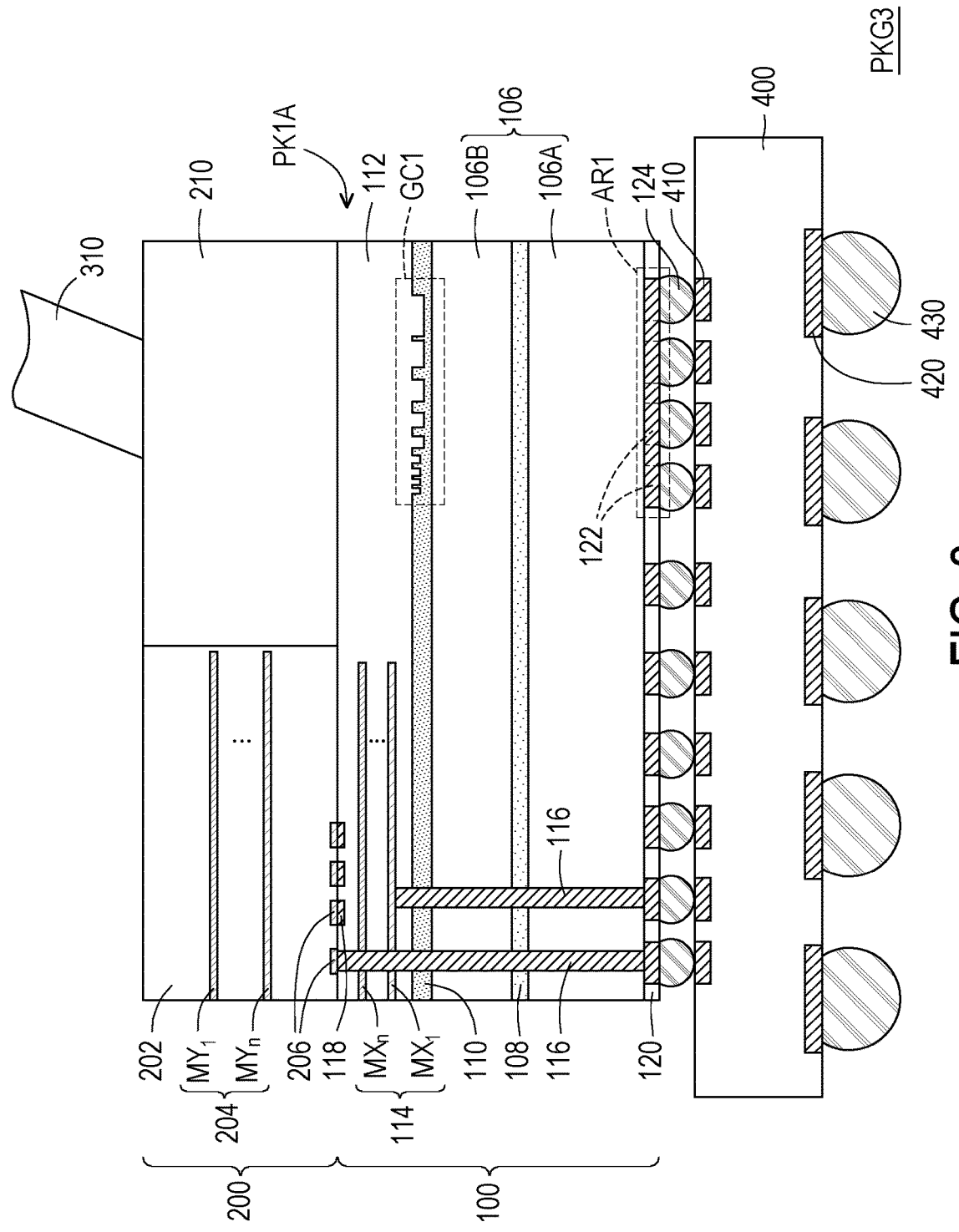
FIG. 3 is a schematic sectional view of a package structure in accordance with some other embodiments of the present disclosure.

FIG. 3 is a schematic sectional view of a package structure in accordance with some other embodiments of the present disclosure. The package structure PKG3 (or semiconductor device) illustrated in FIG. 3 is similar to the package structure PKG2 illustrated in FIG. 2. Therefore, the same reference numerals are used to refer to the same or liked parts, and its detailed description is omitted herein. The difference between the embodiments is that the package structure PK1 is replaced with a modified package structure PK1A (stacked die package).

As illustrated in FIG. 3, in the modified package structure PK1A, in a region below the grating coupler GC1, two or more (in this case four) of the conductive pads 122 are joined together to form an auxiliary reflector structure AR1 (a continuous plate structure). The shape of the auxiliary reflector structure AR1 is not particularly limited, and may be circular, square, polygonal shaped (from the top view) as long as it covers the region below the grating coupler GC1. Depending on an area occupied by the grating coupler GC1, the number of conductive pads 122 that are joined together may also be adjusted. Furthermore, two or more conductive bumps 124 are disposed on and electrically connected to the auxiliary reflector structure AR1. In other words, the single auxiliary reflector structure AR1 is shared between two or more conductive bumps 124. Since the auxiliary reflector structure AR1 is disposed in the photonic die 100 in an area below the grating coupler GC1 and below the reflector structure 108, the auxiliary reflector structure AR1 can ensure that leaked optic energy is recycled to further enhance the coupler efficiency of the grating coupler GC1. In some alternative embodiments, when the auxiliary reflector structure AR1 is present, the reflector structure 108 may be omitted.

Figure 4:
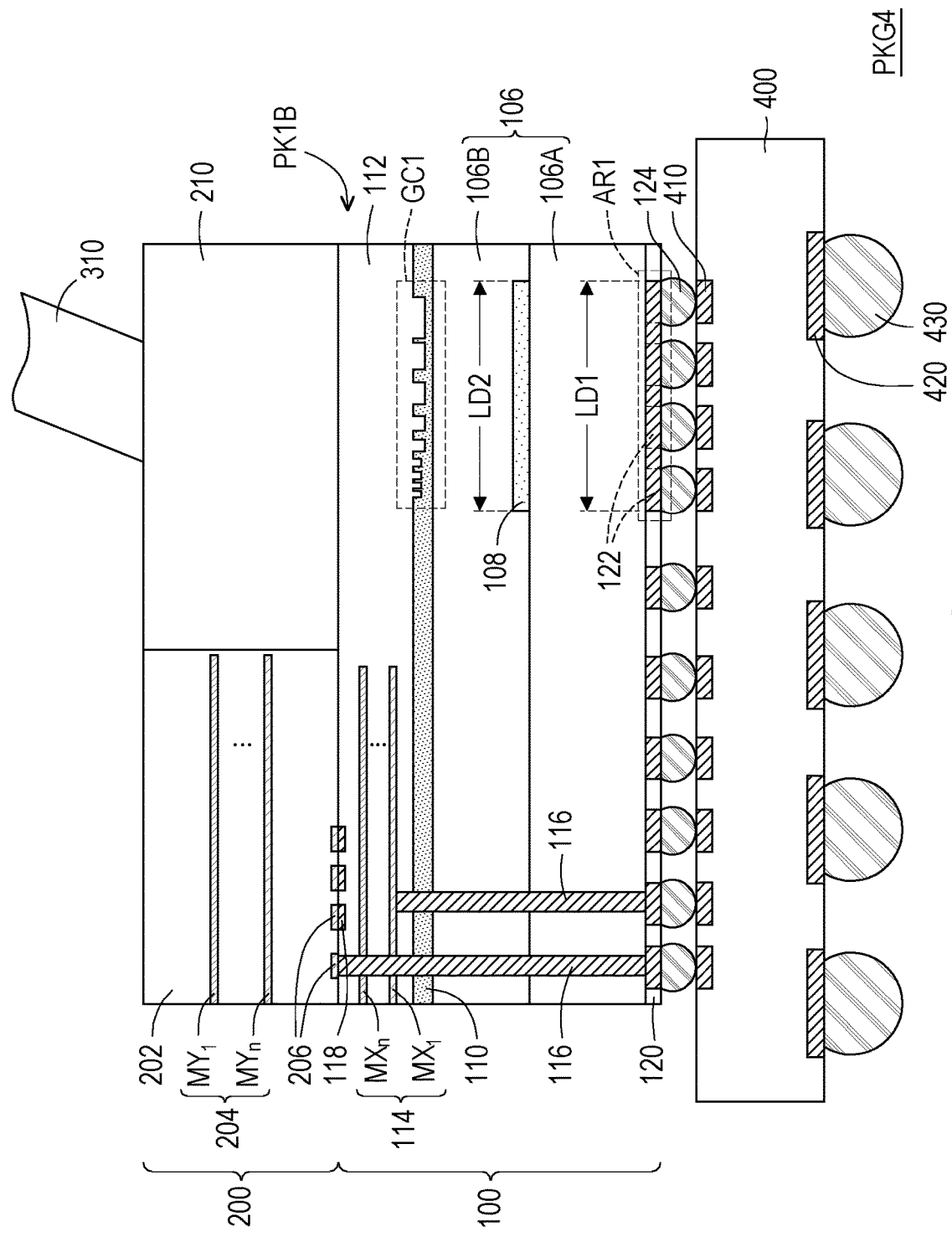
FIG. 4 is a schematic sectional view of a package structure in accordance with some other embodiments of the present disclosure.

FIG. 4 is a schematic sectional view of a package structure in accordance with some other embodiments of the present disclosure. The package structure PKG4 (or semiconductor device) illustrated in FIG. 4 is similar to the package structure PKG3 illustrated in FIG. 3. Therefore, the same reference numerals are used to refer to the same or liked parts, and its detailed description is omitted herein. The difference between the embodiments is that the modified package structure PK1A is replaced with a modified package structure PK1B (stacked die package).

In the previous embodiments, the reflector structure 108 is disposed on and extends across the dielectric layer 106, separating the first dielectric layer 106A from the second dielectric layer 106B, and is exposed at side surfaces of the photonic die 100. However, the disclosure is not limited thereto. For example, as illustrated in FIG. 4, the reflector structure 108 is disposed on the first dielectric layer 106A and embedded in the second dielectric layer 106B, whereby the second dielectric layer 106B is contacting the first dielectric layer 106A. In the exemplary embodiment, a lateral dimension LD2 of the reflector structure 108 is substantially equal to a lateral dimension LD1 of the auxiliary reflector structure AR1. Furthermore, the lateral dimensions LD1, LD2 are substantially equal to a lateral dimension of the grating coupler GC1. Similar to the previous embodiments, in the package structure PKG4, since the reflector structure 108 and the auxiliary reflector structure AR1 are disposed in the photonic die 100 in an area below the grating coupler GC1, the reflector structure 108 and the auxiliary reflector structure AR1 together can ensure that leaked optic energy is recycled to further enhance the coupler efficiency of the grating coupler GC1.

Figure 5:
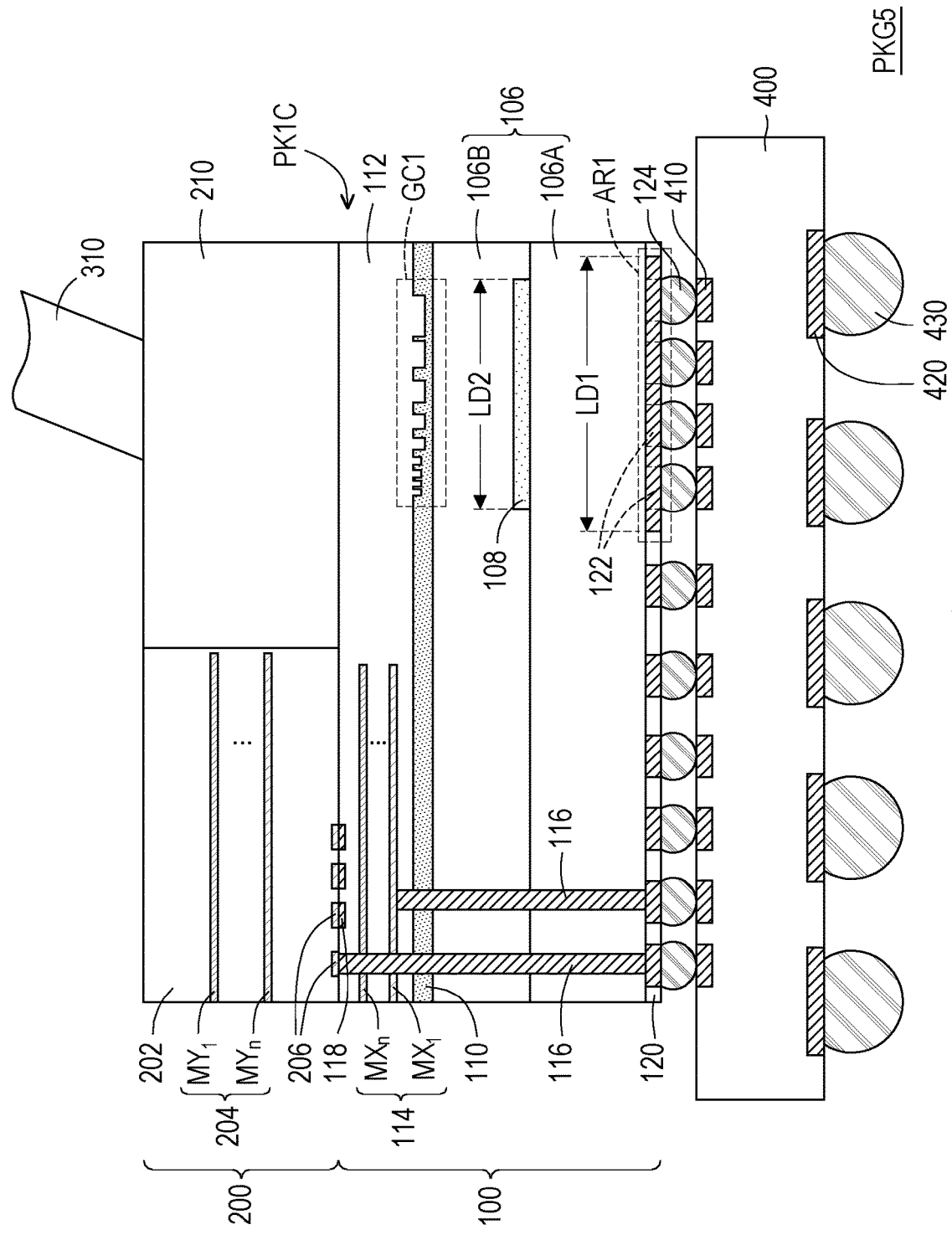
FIG. 5 is a schematic sectional view of a package structure in accordance with some other embodiments of the present disclosure.

FIG. 5 is a schematic sectional view of a package structure in accordance with some other embodiments of the present disclosure. The package structure PKG5 (or semiconductor device) illustrated in FIG. 5 is similar to the package structure PKG4 illustrated in FIG. 4. Therefore, the same reference numerals are used to refer to the same or liked parts, and its detailed description is omitted herein. The difference between the embodiments is that the modified package structure PK1B is replaced with a modified package structure PK1C (stacked die package).

In FIG. 4, the lateral dimension LD1 of the auxiliary reflector structure AR1 is substantially equal to the lateral dimension LD2 of the reflector structure 108. However, the disclosure is not limited thereto. For example, as illustrated in FIG. 1, the lateral dimension LD1 of the auxiliary reflector structure AR1 is greater than the lateral dimension LD2 of the reflector structure 108. In other words, the lateral dimensions LD1, LD2 may be appropriately adjusted based on design requirement, as long as they cover an area located below the grating coupler GC1. Similar to the previous embodiments, in the package structure PKG5, since the reflector structure 108 and the auxiliary reflector structure AR1 are disposed in the photonic die 100 in an area below the grating coupler GC1, the reflector structure 108 and the auxiliary reflector structure AR1 together can ensure that leaked optic energy is recycled to further enhance the coupler efficiency of the grating coupler GC1.

Figure 6:
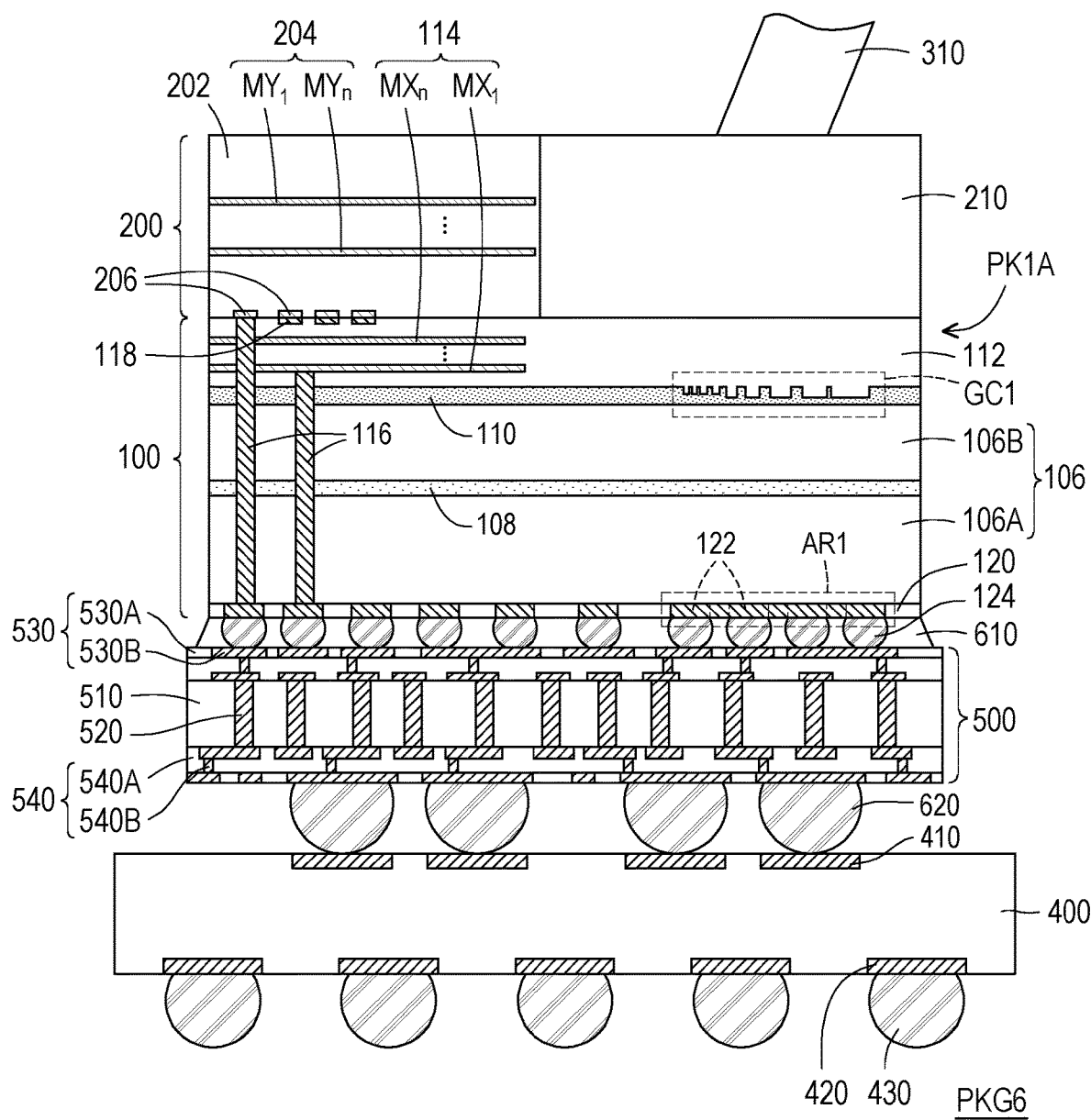
FIG. 6 is a schematic sectional view of a package structure in accordance with some other embodiments of the present disclosure.

FIG. 6 is a schematic sectional view of a package structure in accordance with some other embodiments of the present disclosure. The package structure PKG6 (or semiconductor device) illustrated in FIG. 6 is similar to the package structure PKG3 illustrated in FIG. 3. Therefore, the same reference numerals are used to refer to the same or liked parts, and its detailed description is omitted herein. The difference between the embodiments is that an interposer structure 500 is further provided in the package structure PKG6.

As illustrated in FIG. 6, the same package structure PK1A (shown in FIG. 3) is mounted onto an interposer structure 500 over the circuit substrate 400. In other words, the interposer structure 500 is disposed in between the circuit substrate 400 and the conductive bumps 124 of the package structure PK1A. In some embodiments, the package structure PK1A (stacked die package) is s disposed on and electrically connected to the circuit substrate 400 through the conductive bumps 124 and the interposer structure 500.

As further illustrated in FIG. 6, the interposer structure 500 includes a core portion 510, a plurality of vias 520, a redistribution circuit structure 530, and a redistribution circuit structure 540. In some embodiments, the core portion 510 may include a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. In some embodiments, the vias 520 is through silicon vias penetrating the core portions 510. As shown in FIG. 6, the redistribution circuit structure 530 and the redistribution circuit structure 540 are respectively disposed on two opposite sides of the core portion 510. In some embodiments, the redistribution circuit structure 530 and/or the redistribution circuit structure 540 are electrically connected to the vias 520 penetrating the core portion 510. As shown in FIG. 6, the core portion 510 embedded with the vias 520 is located between the redistribution circuit structure 530 and the redistribution circuit structure 540. Through the vias 520, the redistribution circuit structure 530 and the redistribution circuit structure 540 are electrically connected to each other.

In some embodiments, the redistribution circuit structure 530 includes sequentially forming one or more dielectric layers 530A and one or more metallization layers 530B in alternation, where one metallization layer 530B may be sandwiched between two dielectric layers 530A. As shown in FIG. 6, portions of a top surface of a topmost layer of the metallization layers 530B are respectively exposed by openings formed in a topmost layer of the dielectric layers 530A for connecting with other conductive features, and portions of a bottom surface of a bottommost layer of the metallization layers 530B are respectively exposed by openings formed in a bottommost layer of the dielectric layers 530A for connecting with the vias 520. The numbers of the metallization layers and the dielectric layers included in the redistribution circuit structure 530 are not limited thereto, and may be designated and selected based on the demand.

Similarly, the redistribution circuit structure 540 includes sequentially forming one or more dielectric layers 540A and one or more metallization layers 540B in alternation, where one metallization layer 540B may be sandwiched between two dielectric layers 540A. As shown in FIG. 6, portions of a top surface of a topmost layer of the metallization layers 540B are respectively exposed by openings formed in a topmost layer of the dielectric layers 540A for connecting with the vias 520, and portions of a bottom surface of a bottommost layer of the metallization layers 540B are respectively exposed by openings formed in a bottommost layer of the dielectric layers 540A for connecting with other conductive features. The numbers of the metallization layers and the dielectric layers included in the redistribution circuit structure 540 are not limited thereto, and may be designated and selected based on the demand.

In certain embodiments, the materials of the dielectric layers 530A and the dielectric layers 540A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 530A and the dielectric layers 540A formed by suitable fabrication techniques such as spin-on coating, chemical vapor deposition (CVD), plasma-enhanced chemical vapor deposition (PECVD), or the like. The disclosure is not limited thereto. In one embodiment, the materials of the dielectric layers 530A and the dielectric layers 540A may be the same. In an alternative embodiment, the materials of the dielectric layers 540A and the dielectric layers 540B may be different.

In certain embodiments, the material of the metallization layers 530B and the metallization layers 540B may be made of conductive materials formed by electroplating or deposition, such as aluminum, titanium, copper, nickel, tungsten, and/or alloys thereof, which may be patterned using a photolithography and etching process. In some embodiments, the metallization layers 530B and the metallization layers 540B may be patterned copper layers or other suitable patterned metal layers. In one embodiment, the materials of the metallization layers 530B and the metallization layers 540B may be the same. In an alternative embodiment, the materials of the metallization layers 530B and the metallization layers 540B may be different.

In some embodiments, the package structure PK1A is electrically connected to the redistribution circuit structure 530 of the interposer structure 500 by physically joining the conductive bumps 124 to the metallization layers 530B. In some embodiments, an underfill structure 610 is formed on the interposer structure 500 to cover and surround the conductive bumps 124. In other words, the underfill structure 610 fills into a space located between the package structure PK1A and the interposer structure 500. Furthermore, in some embodiments, a plurality of conductive terminals 620 are respectively formed on the metallization layers 540B (or bonding pads) of the redistribution circuit structure 540. In other words, the interposer structure 500 is electrically connected to the circuit substrate 400 through the redistribution circuit structure 540 and the conductive terminals 620. In some embodiments, the conductive terminals 620 are, for example, chip connectors or BGA balls.

Referring still to FIG. 6, in some embodiments, the package structure PK1A (stacked die package) illustrated in FIG. 3 is provided and bonded to the interposer structure 500, and the interposer structure 500 is bonded to the circuit substrate 400 to form the package structure PKG6 having a stacked structure. In the exemplary embodiment, the package structure PK1A is disposed on and electrically connected to the interposer structure 500 through the conductive bumps 124, while the interposer structure 500 is disposed on and electrically connected to the circuit substrate 400 through the conductive terminals 620. In such embodiment, the conductive bumps 124 are, for example, micro-bumps while the conductive terminals 620 are chip connectors, and the conductive terminals 430 are solder balls or BGA balls. In certain embodiments, the package structure PKG6 depicted in FIG. 6 may be formed by chip on wafer on substrate (CoWoS) packaging processes.

Figure 7:
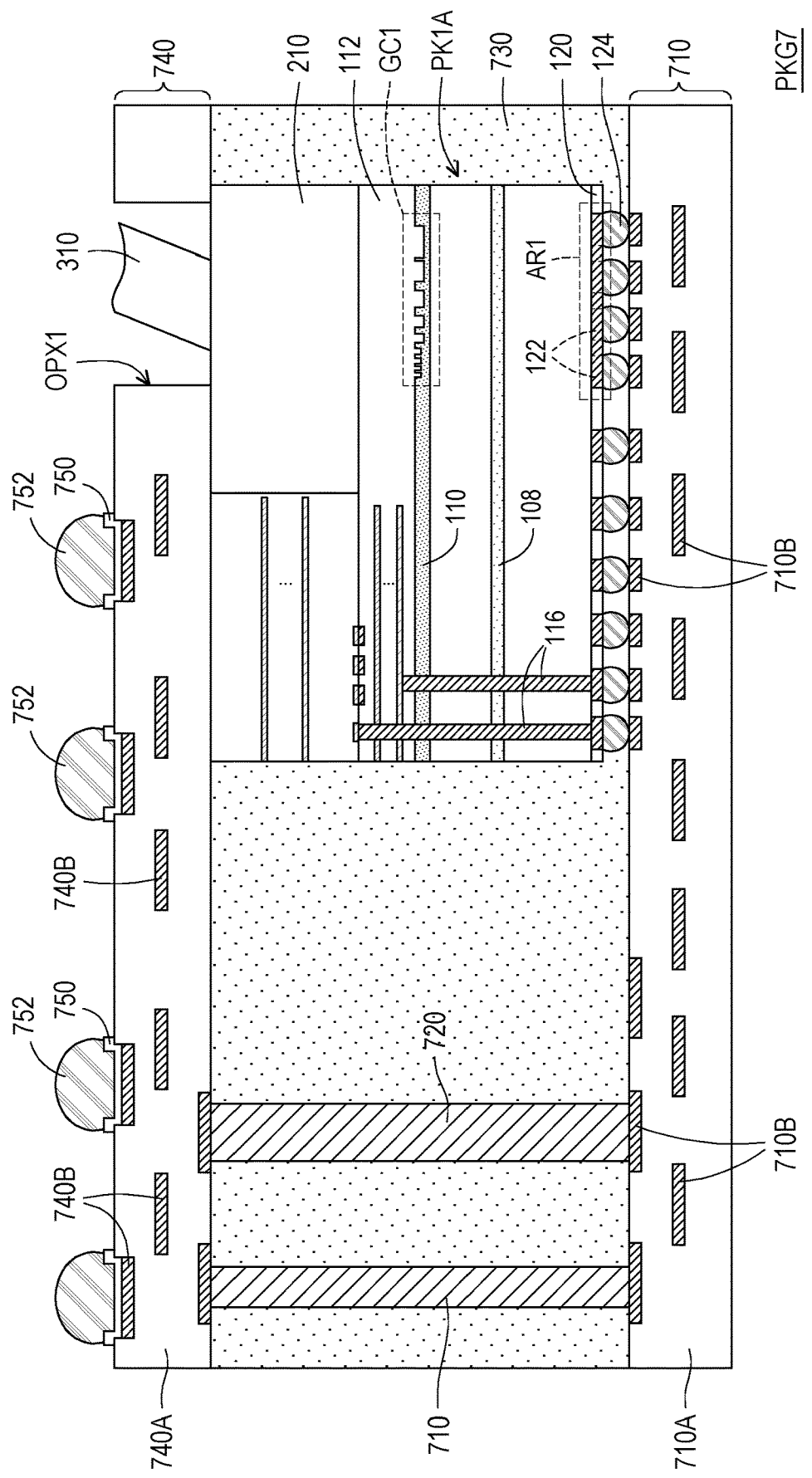
FIG. 7 is a schematic sectional view of a package structure in accordance with some other embodiments of the present disclosure.

FIG. 7 is a schematic sectional view of a package structure in accordance with some other embodiments of the present disclosure. As illustrated in FIG. 7, the package structure PK1A (stacked die package) illustrated in FIG. 3 is bonded onto a redistribution layer 710 by flip chip bonding. In some embodiments, the redistribution layer 710 includes sequentially forming one or more dielectric layers 710A and one or more metallization layers 710B in alternation, where one metallization layer 710B may be sandwiched between two dielectric layers 710A. A material of the dielectric layers 710A and a material of the metallization layers 710B may be similar to the materials of the dielectric layers 530A and the metallization layers 530B described above. Therefore, the details of the dielectric layers 710A and the metallization layers 710B will be omitted herein. In some embodiments, the package structure PK1A is electrically connected to the metallization layer 710B of the redistribution layer 710 through the conductive bumps 124.

In some embodiments, a plurality of through insulator vias 720 is disposed on the redistribution layer 710 around the package structure PK1A. For example, the through insulator vias 720 are electrically connected to the metallization layers 710B. In some embodiments, the through insulator vias 720 are through integrated fan-out ("InFO") vias. In one embodiment, the formation of the through insulator vias 720 includes forming a mask pattern (not shown) with openings, then forming a metallic material (not shown) filling up the openings by electroplating or deposition, and removing the mask pattern to form the through insulator vias 720 on the redistribution layer 710. The material of the mask pattern may include a positive photo-resist or a negative photo-resist. In one embodiment, the material of the through insulator vias 720 may include a metal material such as copper or copper alloys, or the like. However, the disclosure is not limited thereto.

In some embodiments, an insulating encapsulant 730 is formed on the redistribution later 710 to encapsulate the package structure PK1A and the through insulator vias 720. In certain embodiments, a material of the insulating encapsulant 730 includes polymers (such as epoxy resins, phenolic resins, silicon-containing resins, or other suitable resins), dielectric materials having low permittivity (Dk) and low loss tangent (Df) properties, or other suitable materials. In some embodiments, the insulating encapsulant 730 may further include inorganic filler or inorganic compound (e.g. silica, clay, and so on) which can be added therein to optimize coefficient of thermal expansion (CTE) of the insulating encapsulant 730. In certain embodiments, the inorganic fillers may be dielectric particles of $SiO_2$, $Al_2O_3$, silica, or the like, and may have spherical shapes. In some embodiments, fine fillers or large fillers may be used as the filler particles based on requirement.

In some embodiments, one or more semiconductor dies (not shown) may be embedded in the insulating encapsulant 730 aside the package structure PK1A. For example, the semiconductor dies may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

As further illustrated in FIG. 7, a second redistribution layer 740 is disposed on the insulating encapsulant 730. For example, the second redistribution layer 740 is electrically connected to the through insulator vias 720, and may be electrically connected to the package structure PK1A. In some embodiments, the second redistribution layer 740 includes an opening OPX1, whereby the fiber structure 310 is disposed in the opening over the gap filling layer 210 of the package structure PK1A. In some embodiments, the redistribution layer 740 includes sequentially forming one or more dielectric layers 740A and one or more metallization layers 740B in alternation, where one metallization layer 740B may be sandwiched between two dielectric layers 740A. A material of the dielectric layers 740A and a material of the metallization layers 740B may be similar to the materials of the dielectric layers 530A and the metallization layers 530B described above. Therefore, the details of the dielectric layers 740A and the metallization layers 740B will be omitted herein.

After forming the second redistribution layer 740, a plurality of conductive pads 750 may be disposed on an exposed top surface of the topmost layer of the metallization layers 740B for electrically connecting with conductive balls. In certain embodiments, the conductive pads 750 are for example, under-ball metallurgy (UBM) patterns used for ball mount. As shown in FIG. 7, the conductive pads 750 are formed on and electrically connected to the second redistribution layer 740. In some embodiments, the materials of the conductive pads 750 may include copper, nickel, titanium, tungsten, or alloys thereof or the like, and may be formed by an electroplating process, for example. The number of conductive pads 750 are not limited in this disclosure, and may be selected based on the design layout.

In some embodiments, after forming the conductive pads 750, a plurality of conductive balls 752 is disposed on the conductive pads 750 and over the second redistribution layer 740. In some embodiments, the conductive balls 752 may be disposed on the conductive pads 750 by a ball placement process or reflow process. In some embodiments, the conductive balls 752 are, for example, solder balls or ball grid array (BGA) balls. In some embodiments, the conductive balls 752 are connected to the second redistribution layer 740 through the conductive pads 750. In certain embodiments, some of the conductive balls 752 may be electrically connected to the photonic die 100 or the electronic die 200 of the package structure PK1A through the second redistribution layer 740 and/or the redistribution layer 710. Furthermore, some of the conductive balls 752 may be electrically connected to the through insulator vias 720 through the second redistribution layer 740. The number of the conductive balls 752 is not limited to the disclosure, and may be designated and selected based on the number of the conductive pads 750. Up to here, a package structure PKG7 (or semiconductor device) in accordance with some other embodiments of the present disclosure is accomplished.

In the above-mentioned embodiments, the package structure includes at least a photonic die and an electronic die disposed on the photonic die. The photonic die includes a grating coupler, and a reflector structure disposed below the grating coupler. Since the reflector structure is disposed in the photonic die in an area below the grating coupler, the reflector structure can recycle leaked optic energy to further enhance the coupler efficiency of the grating coupler. In addition, the stacked die package including the photonic die and electronic die may be integrated in different package types or modules, such as CoWos, flip chip, InFO (integrated fan-out)/fan-out WLP (wafer level packaging). Overall, the packaging of the photonic die is more flexible, chip function integration including photonics, integrated circuits application may be readily achieved for enhancing optical performance.

In accordance with some embodiments of the present disclosure, a package structure includes a photonic die, an electronic die and a gap filling layer. The photonic die includes a dielectric layer, a silicon layer, a reflector structure and a plurality of connection pads. The silicon layer is disposed on the dielectric layer, wherein the silicon layer includes a grating coupler having a plurality of first trench patterns with a first depth and a plurality of second trench patterns with a second depth, wherein the first depth is different than the second depth. The reflector structure is embedded in the dielectric layer below the grating coupler. The connection pads are disposed over the dielectric layer. The electronic die is disposed on the photonic die, wherein the electronic die includes a plurality of bonding pads bonded to the connection pads of the photonic die. The gap filling layer is disposed on the photonic die and surrounding the electronic die.

In accordance with some other embodiments of the present disclosure, a semiconductor device includes a stacked die package and a plurality of conductive bumps. The stacked die package includes an electronic die stacked on a photonic die. The photonic die includes a grating coupler, a plurality of conductive pads, an interconnection layer, and a plurality of through dielectric vias. The grating coupler has a plurality of trench patterns. The conductive pads are located over a surface of the photonic die. The interconnection layer is disposed in between the electronic die and the conductive pads. The through dielectric vias are electrically connecting the conductive pads to the interconnection layer, and electrically connecting the conductive pads to the electronic die. The conductive bumps are disposed on and electrically connected to the conductive pads of the stacked die package.

In accordance with yet another embodiment of the present disclosure, a method of fabricating a package structure is described. The method includes the following steps. A photonic die is formed. The photonic die is formed by the following steps. A dielectric layer and a reflector structure are formed on a carrier, wherein the reflector structure is embedded in the dielectric layer. A silicon layer is formed on the dielectric layer, and the silicon layer is patterned to form a grating coupler having a plurality of first trench patterns with a first depth and a plurality of second trench patterns with a second depth, wherein the first depth is different than the second depth, and wherein the reflector structure is located below the grating coupler. A plurality of connection pads is formed over the dielectric layer, and the carrier is debonded. An electronic die is disposed on the photonic die, wherein the electronic die includes a plurality of bonding pads bonded to the plurality of connection pads of the photonic die. A gap filling layer is formed on the photonic die and surrounding the electronic die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a photonic die, comprising:
      a dielectric layer;
      a silicon layer disposed on the dielectric layer, wherein the silicon layer includes a grating coupler having a plurality of first trench patterns with a first depth and a plurality of second trench patterns with a second depth, wherein the first depth is different than the second depth;
      a reflector structure embedded in the dielectric layer below the grating coupler;
      a plurality of connection pads disposed over the dielectric layer;
   an electronic die disposed on the photonic die, wherein the electronic die comprises a plurality of bonding pads bonded to the plurality of connection pads of the photonic die; and
   a gap filling layer disposed on the photonic die and surrounding the electronic die.

2. The package structure according to claim 1, wherein the photonic die further comprises a plurality of conductive pads disposed on a surface of the dielectric layer opposite to where the silicon layer is located.

3. The package structure according to claim 2, wherein in a region below the grating coupler, two or more of the plurality of conductive pads are joined together to form an auxiliary reflector structure.

4. The package structure according to claim 3, further comprising two or more conductive bumps disposed on and electrically connected to the auxiliary reflector structure.

5. The package structure according to claim 2, further comprising a plurality of through dielectric vias electrically connecting the plurality of bonding pads of the electronic die to the plurality of conductive pads of the photonic die, wherein the through dielectric vias passes through the silicon layer and the reflector structure.

6. The package structure according to claim 1, wherein a ratio of a thickness of the reflector structure to a thickness of the silicon layer is in a range of 1:1 to 1:30.

7. The package structure according to claim 1, further comprising a fiber structure disposed on the gap filling layer and overlapped with the grating coupler, and a fiber tilt angle of the fiber structure is in a range of 5° to 15°.

8. The package structure according to claim 1, wherein the photonic die further comprises an interconnection layer disposed in between the plurality of connection pads and the silicon layer, and a through dielectric via that passes through the reflector structure and the through dielectric via is electrically connected to the interconnection layer.

9. A semiconductor device, comprising:
   a stacked die package, comprising an electronic die stacked on a photonic die, wherein the photonic die comprises:
      a grating coupler having a plurality of trench patterns;
      a plurality of conductive pads located over a surface of the photonic die;
      an interconnection layer disposed in between the electronic die and the plurality of conductive pads; and
      a plurality of through dielectric vias electrically connecting the plurality of conductive pads to the interconnection layer, and electrically connecting the plurality of conductive pads to the electronic die;
   a plurality of conductive bumps disposed on and electrically connected to the plurality of conductive pads of the stacked die package.

10. The semiconductor device according to claim 9, further comprising a circuit substrate, wherein the stacked die package is disposed on and electrically connected to the circuit substrate through the plurality of conductive bumps.

11. The semiconductor device according to claim 10, further comprising an interposer structure disposed in between the circuit substrate and the plurality of conductive bumps, wherein the stacked die package is disposed on and electrically connected to the circuit substrate through the plurality of conductive bumps and the interposer structure.

12. The semiconductor device according to claim 9, further comprising an insulating encapsulant encapsulating the stacked die package, and a redistribution structure disposed over the plurality of conductive bumps and the stacked die package, wherein the plurality of conductive bumps is electrically connecting the plurality of conductive pads of the photonic die to the redistribution structure.

13. The semiconductor device according to claim 9, further comprising a reflector structure disposed in between the grating coupler and the plurality of conductive pads, and the reflector structure covers a portion of the grating coupler that is overlapped with the plurality of trench patterns.

14. The semiconductor device according to claim 9, wherein in a region below the grating coupler, two or more of the plurality of conductive pads are joined together to form an auxiliary reflector structure.

15. The semiconductor device according to claim 9, further comprising a fiber structure disposed over the photonic die and overlapped with the grating coupler, and a fiber tilt angle of the fiber structure is in a range of 5° to 15°.

16. A structure, comprising:
   a first die, comprising a plurality of connection pads, a grating coupler and a plurality of conductive pads, wherein the plurality of connection pads and the plurality of conductive pads are located on two opposite sides of the first die;
   a second die stacked on the first die, and comprising a plurality of bonding pads, wherein the plurality of bonding pads is electrically joined with the plurality of connection pads of the first die;
   a fiber structure disposed over the first die; and
   a reflector structure disposed below the grating coupler, wherein the reflector structure, the grating coupler and the fiber structure are overlapped with one another along a first direction,
   wherein a portion of the plurality of conductive pads of the first die are joined together to form an auxiliary reflector structure, and wherein the auxiliary reflector structure is overlapped with the reflector structure, the grating coupler and the fiber structure along the first direction.

17. The structure according to claim 16, wherein a fiber tilt angle of the fiber structure relative to a plane perpendicular to the grating coupler is in a range of 5° to 15°.

18. The structure according to claim 16, wherein the reflector structure is embedded in a dielectric layer of the first die, and sidewalls of the reflector structure are aligned with sidewalls of the dielectric layer.

19. The structure according to claim 16, wherein the first die further comprises a plurality of conductive bumps disposed on and electrically connected to the plurality of conductive pads.

20. The structure according to claim 16, wherein the first die comprises a first interconnection layer having a plurality of metallization layers, the second die comprises a second interconnection layer having a plurality of metallization layers, and wherein the first interconnection layer of the first die is overlapped with the second interconnection layer of the second die along the first direction.

* * * * *